(12) United States Patent
Hariton

(10) Patent No.: US 6,646,463 B1
(45) Date of Patent: *Nov. 11, 2003

(54) IMPEDANCE EMULATOR

(75) Inventor: Dan Ion Hariton, Pinole, CA (US)

(73) Assignee: Alliance Semiconductor, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/082,016

(22) Filed: Feb. 22, 2002

Related U.S. Application Data

(63) Continuation-in-part of application No. 09/637,350, filed on Aug. 15, 2000, now Pat. No. 6,351,137.

(51) Int. Cl.$^7$ .......................... H03K 17/16; G05F 3/02; H03F 1/34
(52) U.S. Cl. .............................. 326/30; 321/21; 321/86; 327/540; 327/541; 330/85; 330/103
(58) Field of Search ............................... 326/30–32, 21, 326/34, 86; 333/22 R, 32; 327/538, 540, 541, 543, 63, 67, 68, 73

(56) References Cited

U.S. PATENT DOCUMENTS

| | | | | |
|---|---|---|---|---|
| 6,249,112 | B1 | * | 6/2001 | Khouri et al. ............... 323/282 |
| 6,351,137 | B1 | * | 2/2002 | Hariton ........................ 326/30 |
| 6,359,505 | B1 | * | 3/2002 | Joffe ............................ 330/69 |
| 6,424,169 | B1 | * | 7/2002 | Partow et al. ................ 326/30 |

* cited by examiner

*Primary Examiner*—Vibol Tan
(74) *Attorney, Agent, or Firm*—Harris Zimmerman

(57) ABSTRACT

A method and device to emulate impedances includes a pair of impedances connected in series between two circuit nodes, the impedances forming a voltage divider having at its midpoint a reference voltage $V_X$. An OP AMP includes a positive input connected to the $V_{X\_}$ node and the negative input connected to the output thereof in a direct feedback loop. The OP AMP output is also connected to a load impedance that is connected either one of the nodes. A transistor may be interposed between the load impedance and the circuit node. The OP AMP may be provided with a negative gain to emulate an inductor. The voltage divider may be variable to emulate a variable impedance.

15 Claims, 15 Drawing Sheets

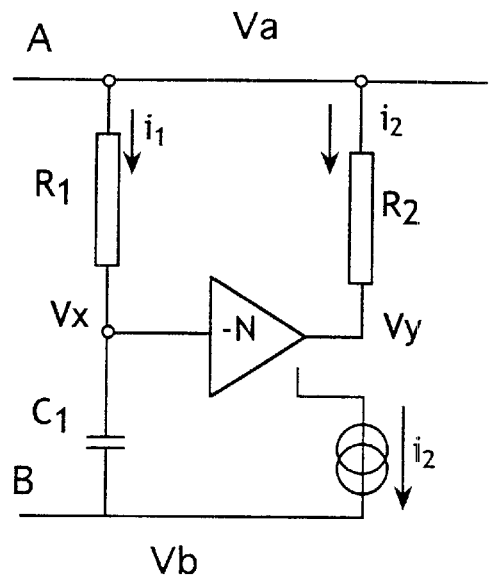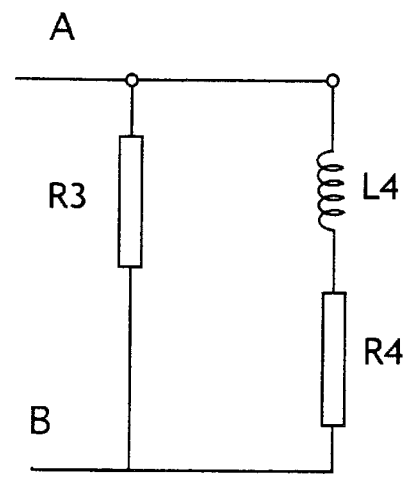
FIG. 17A
FIG. 17B
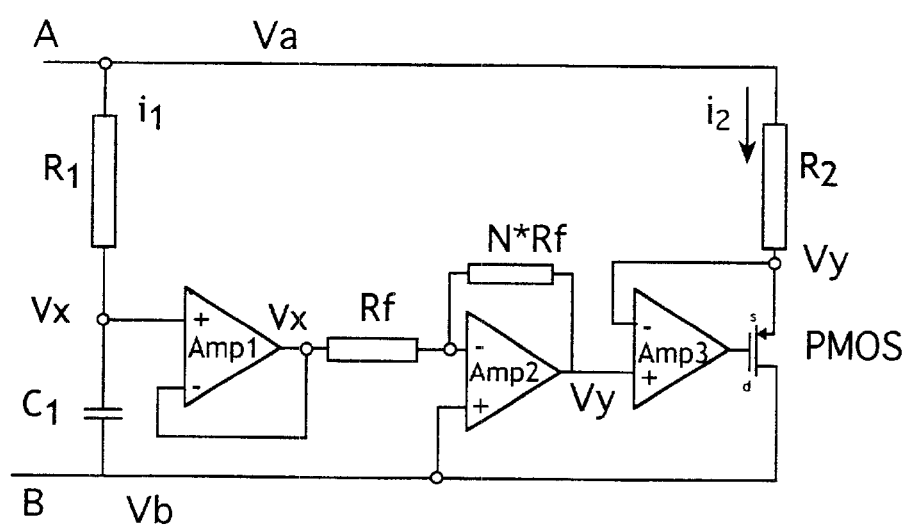
FIG. 18

IMPEDANCE EMULATOR

REFERENCE TO RELATED APPLICATION

This application is a continuation-in-part of application Ser. No. 09/637,350, filed Aug. 15, 2000, now U.S. Pat. No. 6,351,137, for which priority is claimed.

BACKGROUND OF THE INVENTION

The present invention relates to integrated circuits, and, specifically, to impedance emulations that provide functions heretofore unavailable in integrated circuits.

The design and fabrication of integrated circuits has evolved to the point where virtually any digital or analog circuit may be created in silicon or other semiconductor material, and may be replicated in large numbers. Some aspects of circuit design have not been available to IC designers, due primarily to limitations imposed by physics and economics. For example, in some circuit designs there is a need for a relatively large capacitor, which may be fabricated in an IC only by forming parallel conductors in adjacent layers. If the required capacitor is large, the parallel conductors may occupy a significant portion of the total die area, thereby limiting the area available for the remaining components of the circuit. Since die size is linked to device cost, there is a strong economic incentive to avoid circuits that require a large capacitor.

Likewise, in IC circuit designs impedance is formed by various combinations of capacitance and resistance, due to the fact that there is no IC component that provides an inductive impedance. The multi-turn coil, well-known in classic electronics to create inductance, has no counterpart in the IC armamentarium. Although most circuits can be designed using capacitive reactance, the lack of integrated circuit inductance does comprise a design limit in IC layouts.

Assuming, arguendo, that it is generally not practical to incorporate large capacitors in an IC, and it is virtually impossible to incorporate inductors in an IC, there exists a need in the prior art for some way to replicate or emulate inductors and large capacitors, using the circuit components that are readily available in IC design.

SUMMARY OF THE INVENTION

The present invention generally comprises a method and device to replace circuit components that are difficult to form in integrated circuits, or that are too large in area to be economical, by providing component emulators that are simple to form with available IC components. The invention provides functionality, such as inductive impedance or large capacitance, that has been heretofore unattainable in integrated circuits. Furthermore, the invention may provide significant reductions in the die size of integrated circuits. Values of components that are difficult or impossible to integrate can thus be put in silicon.

The method of the invention employs a pair of impedances connected in series across a potential difference, the impedances forming a voltage divider having at its midpoint a reference voltage $V_X$. An equivalent impedance pair network is connected across the potential difference, and the two networks are connected in an H configuration, with the cross-link joining nodes that are both at $V_{X_-}$. The impedances are scaled, so that the first pair have values of $KZ_a$ and $KZ_b$, and the second pair of impedances have values of $KZ_a/(K-1)$ and $KZ_b/(K-1)$.

Any one of the impedance may be replaced by an operational amplifier (OP AMP) having unity gain, in which the output of the OP AMP is connected to the remaining impedance of the modified leg, and the positive input of the OP AMP is connected to the $V_X$ node of the unmodified leg. The negative input of the OP AMP is connected to the output thereof in a direct feedback loop. The unity gain OP AMP forces the output voltage thereof to follow the input voltage $V_X$, as if the impedance had not been removed. By proper choice of components and values, the impedance that is replaced may comprise a large capacitor, and the remaining impedances may comprise resistance and small capacitance, both of which, together with the OP AMP, are easily integrated in a small die area. Thus the output $V_X$ of the OP AMP may be made to emulate the behavior of a large capacitor, in effect forming a virtual capacitor. And the components used in the circuit occupy a die area far smaller than the capacitor that has been replaced.

In another aspect, the impedance emulator described above may be modified by the addition of a transistor having a source/drain circuit connected in place of the eliminated impedance of the H network, with the OP AMP output connected to the transistor gate. The negative input of the OP AMP is connected to the junction of the transistor source/drain circuit and the remaining impedance. This arrangement relieves the OP AMP from acting as a source or drain for the remaining impedance, thereby eliminating unacceptably large current flow through the OP AMP.

In a further aspect, the invention may be configured to emulate an inductive impedance. Using the general circuit arrangement described above, the OP AMP may be provided with a negative gain, and the impedances may be scaled to create a virtual inductor having a predetermined value.

Additionally, the invention may include at least one variable impedance, such as a variable resistor, whereby the emulated impedance may comprise a variable capacitance or a variable inductance.

Impedance emulator circuits disclosed herein may be combined so that the emulated impedance of one circuit may act as a virtual component in a further emulation circuit, whereby a wide range of component impedances values of may be replicated. For example, an inductor emulator circuit may employ a large capacitance to achieve a large inductance value. The large capacitance, which is impractical in an integrated circuit, may be comprised by a capacitor emulator circuit connected appropriately in the inductor emulator circuit. Other such combinations of emulator circuits may be made to create a wide range of capacitor and inductor values.

We have previously disclosed a setup in which one impedance emulator acts as an impedance for another emulator, in a chained effect. A chained emulator works equally well in a floating connection as in a grounded circuit. Sometimes large capacitors are required to handle large currents, at least instantaneously. There is no difference in the current handling ability of an emulated impedance versus an actual impedance. In the emulated impedance the current handling task is being assigned to the amplifier. For example, assuming a very large capacitor 1 F (one farad) has a finite lead resistance of 0.1 ohmand a parasitic RC time constant of 0.1 seconds. We may use this parasitic resistance: a 100 ohm resistor in series with a smaller capacitor (1 mF) is used, creating the same RC time constant RC=0.1 sec., yet with much less current handling capability. Note that the amplifier will have to drive the 0.1 ohm resistor, nearly a short-circuit for the amplifier. The resistor ratio of 100/0.1=1000 performs, via the amplifier, a capacitor multiplication factor of approximately 1000.

BRIEF DESCRIPTION OF THE DRAWING

FIG. 5a is a schematic view of a voltage divider formed by two impedances, one being a capacitor.

FIG. 5b is a schematic view of a voltage divider formed as an H network that is equivalent to the network of FIG. 5a.

FIG. 8b is a schematic view of an impedance network equivalent to the emulator circuit of FIG. 8a.

FIGS. 17A–17B are schematic views of a floating inductive impedance emulator circuit, and the resulting equivalent circuit.

FIG. 18 is a schematic view of one possible practical embodiment of the floating inductive impedance emulator circuit of FIGS. 17.

DESCRIPTION OF THE PREFERRED EMBODIMENT

Figure 1:
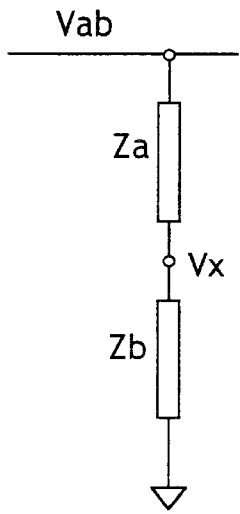
FIG. 1 is a schematic view of a voltage divider formed by two impedances connected between a voltage source and ground.
Figure 2:
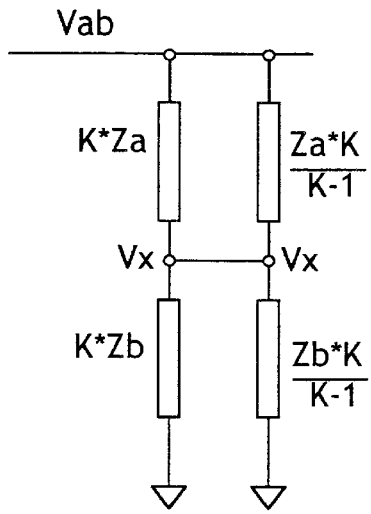
FIG. 2 is a schematic view of a voltage divider formed as an H network that is equivalent to the network of FIG. 1.
Figure 3:
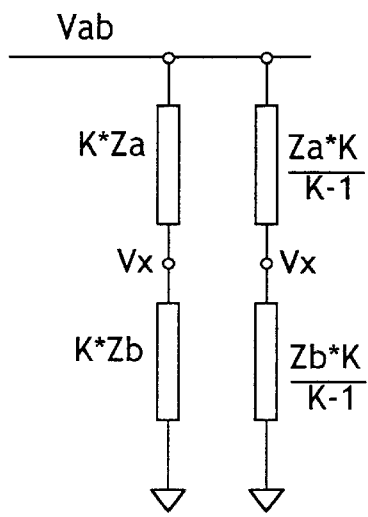
FIG. 3 is a schematic view of a voltage divider network as in FIG. 2, modified by the removal of the cross-link of the network.

The present invention generally comprises a method and device to replace circuit components that are difficult to form in integrated circuits, or that are too large in area to be economical, by providing component emulators that are simple to form with available IC components. With regard to FIG. 1, two impedances, $Z_a$ and $Z_b$, are connected in series between a supply voltage $V_{ab}$ and ground, forming a voltage divider having at its midpoint a voltage $V_x$. As shown in FIG. 2, an equivalent voltage divider network may be formed as an H configuration. In this arrangement, a pair of impedances $KZ_a$ and $KZ_b$ are connected between the supply voltage and ground, and another pair of impedances $KZ_a/K-1$ and $KZ_b/K-1$ are connected between the supply voltage and ground. The midpoints of the paired impedances, which each produce a voltage $V_x$, may be connected together in a virtual short circuit. In FIG. 3, the wire shorting the two $V_x$ nodes is removed. Due to linear scaling, the left hand impedance divider (impedances scaled by a factor of K) generates a voltage $V_x$ equal to the $V_x$ voltage generated by the right hand impedance divider (impedances scaled by a factor of K/(K−1)). These two $V_x$ voltages are a virtual short; that is, their behavior in time is such that they track each other as if a DC and AC short-circuit exists between these two points.

Figure 4A:
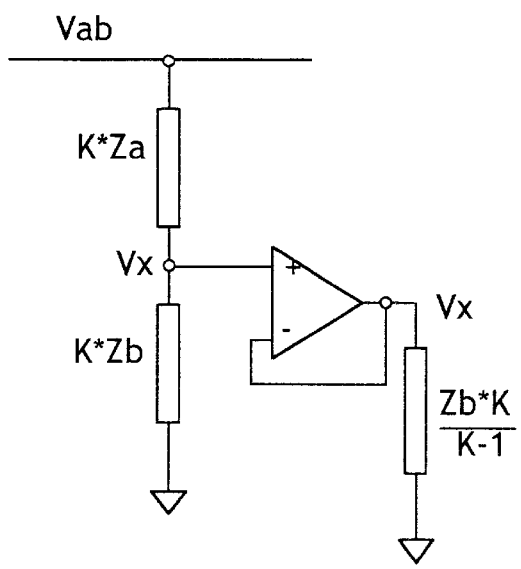
FIG. 4a is a schematic view of an impedance emulator circuit, similar to the networks of FIGS. 3 and 4, in which an OP AMP is substituted for one of the impedances.

With regard to FIG. 4a the top-right impedance (Za*K/(K−1) of FIG. 3) is removed. A unity gain OP AMP is substituted, with the output of the OP AMP connected to the remaining impedance of the modified leg, and the positive input of the OP AMP connected to the $V_x$ node of the unmodified leg. The negative input of the OP AMP is connected to the output thereof in a direct feedback loop. The ground return current is the same as the one in FIG.3. The unity-gain amplifier forces the $V_x$ voltage from the left side to the right side, and sources current into the Zb*K/(K−1) output impedance. Thus it is significant to note that the right hand node at $V_x$ behaves exactly the same as the right hand node of FIG. 3, even though the upper right hand impedance Za*K/(K−1) has been eliminated.

Figure 4B:
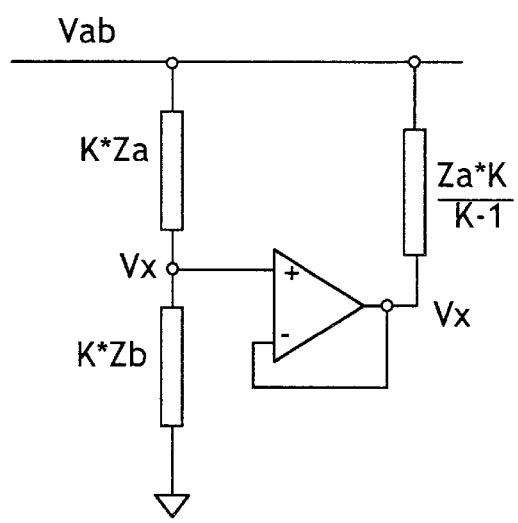
FIG. 4b is a schematic view of an impedance emulator circuit as in FIG. 4a, in which an OP AMP is substituted for another impedance.

With regard to FIG. 4b, the bottom-right impedance (Zb*K/(K−1), see FIG.3) is removed, and replaced by an OP AMP connected as shown in FIG. 4a. The current drawn from the $V_{ab}$ line is the same as in FIG.3. The amplifier output sinks current from the Za*K/(K−1) impedance. The impedance seen from the $V_{ab}$ line to ground is the same as the impedance seen from $V_{ab}$-to-ground in FIG. 1, in FIG. 2, and in FIG. 3. Note that $V_{ab}$ is just a node voltage that can have any value. $V_{ab}$ may also be the output of a current source. This impedance elimination neither assumes nor restricts $V_{ab}$ to be only a voltage source driven output; i.e. the impedance driving the $V_{ab}$ line can have any value, low or high.

Figure 4C:
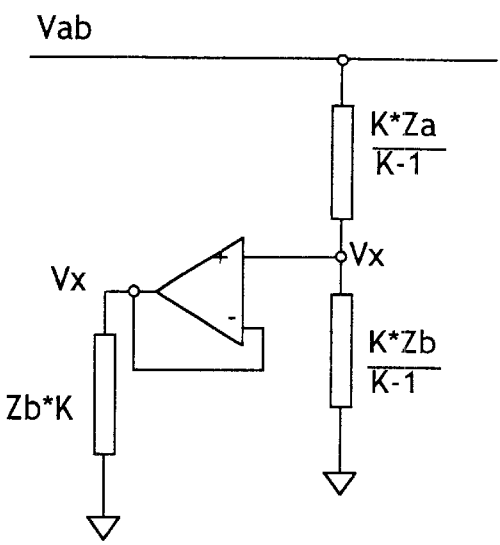
FIG. 4c is a schematic view of an impedance emulator circuit as in FIGS. 4a and 4b, in which an OP AMP is substituted for a further impedance.
Figure 4D:
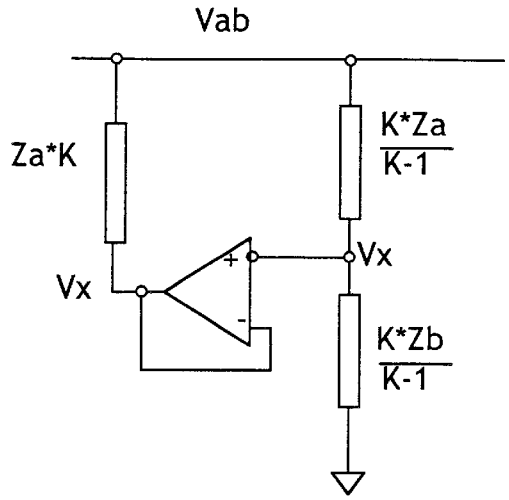
FIG. 4d is a schematic view of an impedance emulator circuit as in FIG. 4a–4d, in which an OP AMP is substituted for another impedance.

With regard to FIG. 4c, the top-left impedance (Za*K, see FIG. 3) is removed and replaced by a unity gain OP AMP connected as described previously. The ground return current is the same as in FIG. 3. The unity-gain amplifier forces the $V_X$ voltage from the right side to the left side. The amplifier sources current into the Zb*K output impedance. In this example, the left hand node at $V_X$ behaves exactly the same as the left hand node of FIG. 3, even though the upper left impedance Za*K has been eliminated. Likewise, in FIG. 4d the bottom-left impedance (Zb*K, see FIG. 3) is removed and replaced by an OP AMP connected as described previously. The current drawn from the $V_{ab}$ line is the same as the one in FIG. 3. The amplifier output sinks current from the Za*K impedance. Here again, the impedance seen from the $V_{ab}$ line to ground is the same as the impedance seen from $V_{ab}$-to-ground in FIG. 1, in FIG. 2, FIG. 3, and in FIG. 4b.

Figures 5A, 5B:
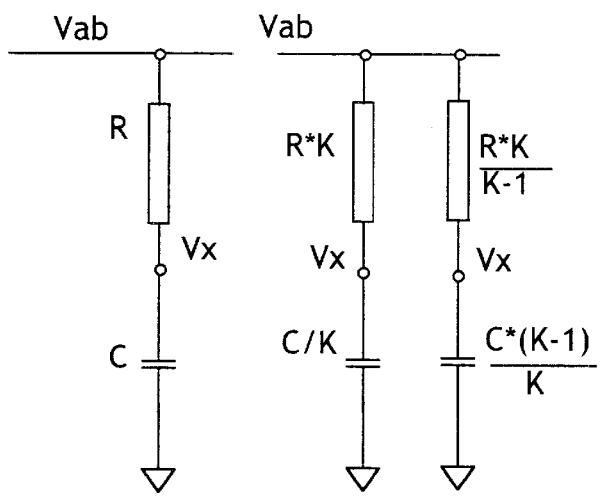
Figure 5C:
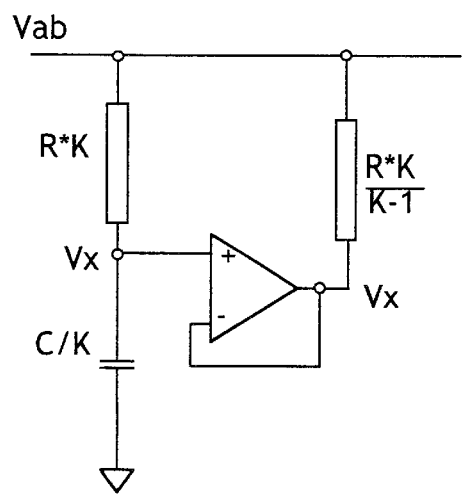
FIG. 5c is a schematic view of an impedance emulator circuit, similar to the networks of FIGS. 5a–5b, in which an OP AMP is substituted for one of the impedances.
Figure 6A:
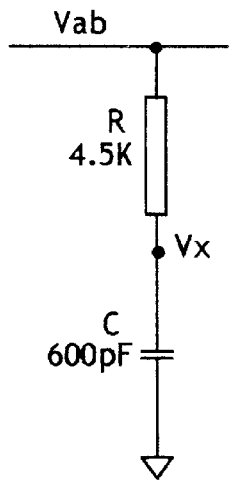
FIGS. 6a–6c are schematic views of circuits corresponding to FIGS. 5a–5c with real component values.
Figure 6B:
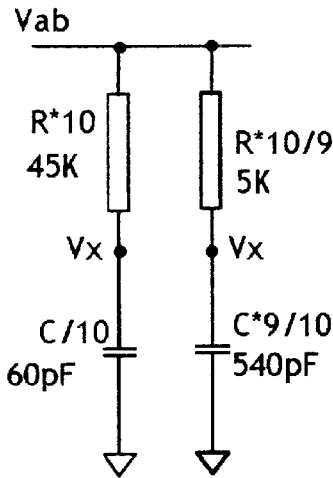
Figure 6C:
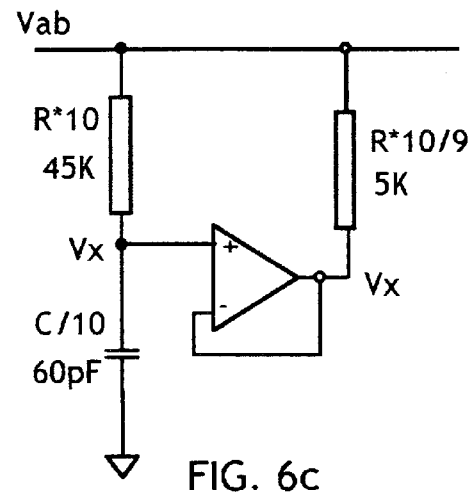

It is important to note that the impedances described in FIGS. 1–4 may comprise resistance, capacitance, and/or inductance, and any combination thereof. Thus, for example, the circuit of FIG. 5a, which corresponds to the simple series voltage divider of FIG. 1, consists of resistor R and capacitor C. The equivalent voltage divider, corresponding to FIG. 3, is shown in FIG. 5b, and the equivalent OP AMP circuit of FIG. 4a is shown in FIG. 5c. In FIG. 5c the capacitor component is reduced to C/K (K>>1) from the original component C in FIG. 5a. The equivalent C value stays the same in FIG. 5a–5c. Assuming for demonstration purposes that C=600 pF, R=4.5 Kohms, and K=10, these values, when substituted in the circuits of FIGS. 5a–5c, form the circuits shown in FIGS. 6a–6c, respectively. The impedance to ground from the $V_{ab}$ line remains the same in FIGS. 5a–5c as in FIGS. 6a–6c. Comparing the circuits of FIGS. 6b and 6c, it is significant to note that the 540 pF capacitor is eliminated, while the resulting circuit functions exactly as before. The silicon die size required by the 45 KΩ resistor, 60 pF capacitor and the amplifier in FIG. 6c is much less than the area required by the 540 pF capacitor of FIG. 6b. Assuming that the circuit of FIG. 6a occupies 100% of a silicon die area, the circuit of FIG. 6c occupies about 20% of the die area, and approximately 80% of silicon die area is saved.

Figure 7A:
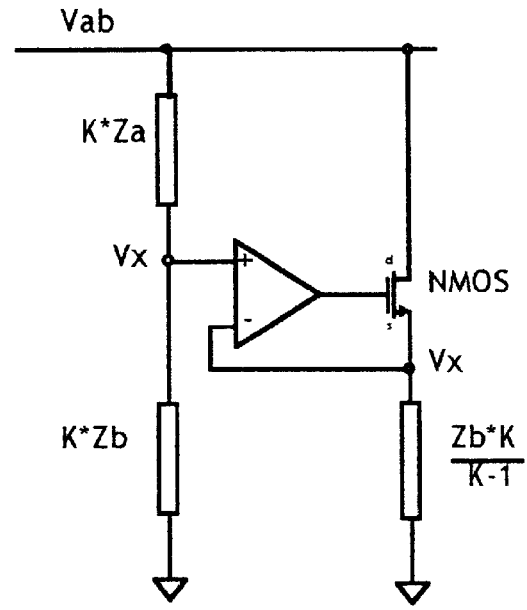
FIGS. 7a–7d are schematic views of circuits corresponding to FIGS. 4a–4d, with the addition of a transistor connected in place of the removed impedance in the network.
Figure 7B:
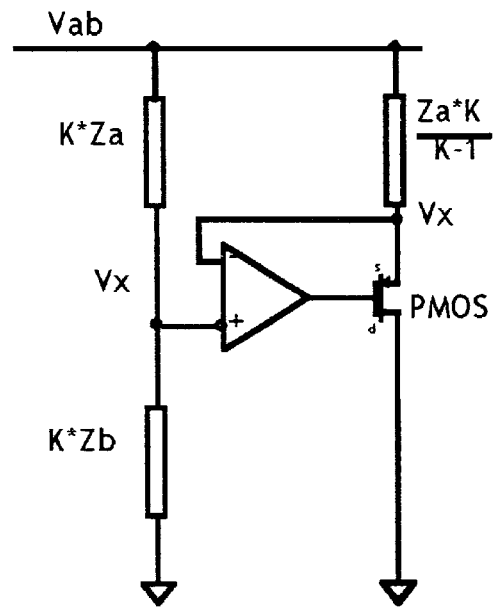
Figure 7C:
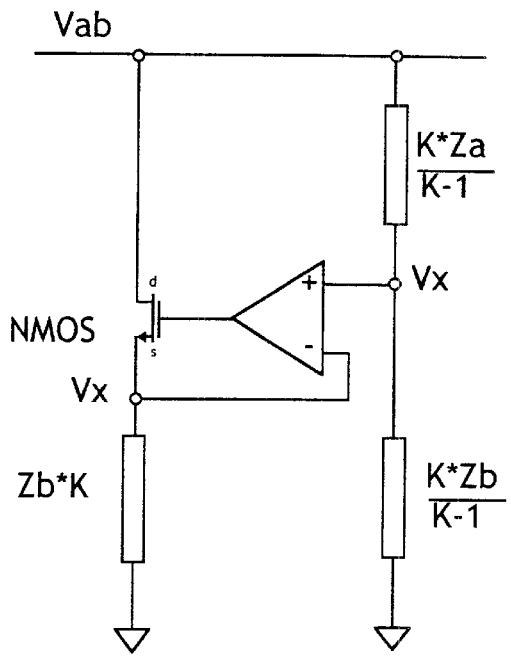
Figure 7D:
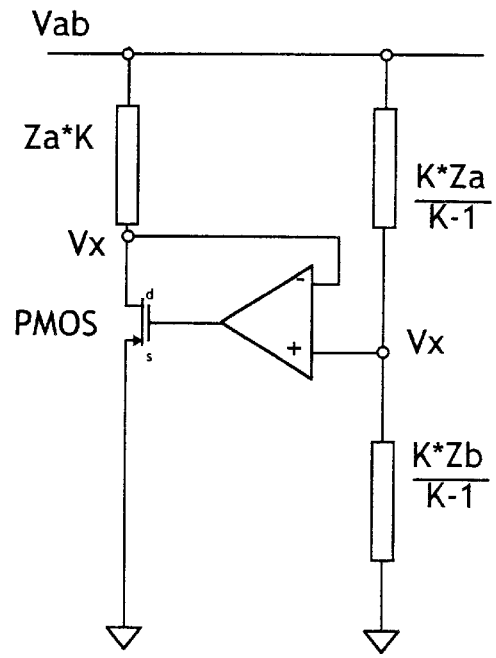

With regard to FIG. 7a, the circuit of FIG. 4a is augmented by the introduction of an NMOS transistor having a source/drain circuit connected in place of the eliminated impedance of the H network, with the OP AMP output connected to the transistor gate. The negative input of the OP AMP is connected to the junction of the transistor source/drain circuit and the remaining impedance. This arrangement relieves the OP AMP from acting as a source or drain for the remaining impedance, thereby eliminating unacceptably large current flow through the OP AMP. Likewise, the circuits of FIGS. 7b–7d correspond to the circuits of FIGS. 4b–4d with the addition of a similarly connected transistor. In each of them the impedance of the $V_{ab}$-to-ground path is equal to: Zab=Za+Zb, and the current sourced from $V_{ab}$ equals the current sunk into ground: Iab=$V_{ab}$/(Za+Zb).

Figure 8A:
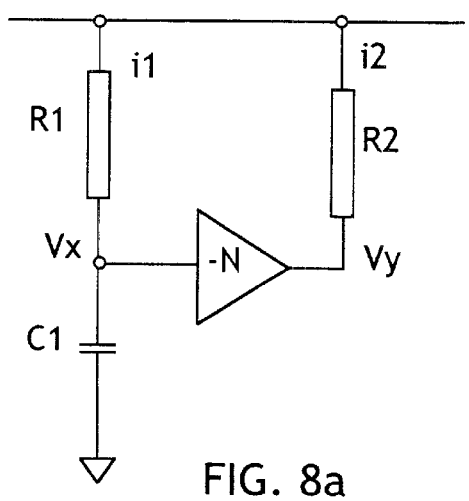
FIG. 8a is a schematic view of an inductance emulator circuit.
Figure 8B:
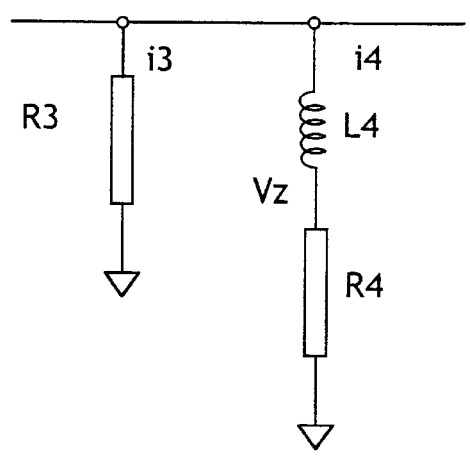

With regard to FIG. 8a, the invention also encompasses the emulation of an inductive impedance. Resistor $R_1$ and capacitor $C_1$ form a voltage divider between the supply voltage and ground, defining a midpoint node voltage $V_X$. An amplifier is connected between the midpoint node and a resistor $R_2$, which in turn is connected to the supply voltage. The amplifier has a negative gain of –N, and the output of the amplifier at the node connection with $R_2$ is $V_Y$. The inductor emulation circuit of FIG. 8a is equivalent to an inductor circuit as shown in FIG. 8b. The following formulae indicate the relationship between $R_1$, $R_2$, amplifier gain (–N), and $C_1$ to the component values $R_3$, $R_4$, $L_4$ of FIG. 8b:

$$R_3 = \frac{R_1 * R_2}{R_1 + R_2}$$

$$R_4 = \frac{1}{N/R_2 - 1/R_1}$$

$$L_4 = C_1 * R_1 * R_4$$

Figure 9A:
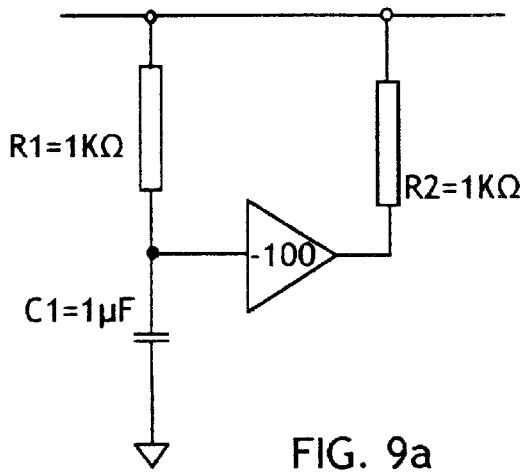
FIGS. 9a and 9b are schematic views of circuits corresponding to FIGS. 8a and 8b with real component values.
Figure 9B:
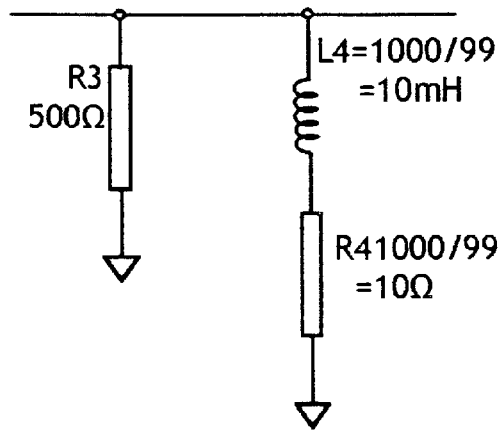

A practical example of the inductor emulator circuit of FIG. 8a, using real component values, is shown in FIG. 9a, and the equivalent inductive network is shown in FIG. 9b. Given that:

$R_1$=$R_2$=1 KΩ

$C_1$=1 μF=$10^{-6}$ F

N=–100

The resulting equivalent inductor circuit of FIG. 9b has the following values:

$R_3$=500Ω

$R_4$=1000/99≈10Ω

$L_4$=1/99 H≈10 mH

Figure 11:
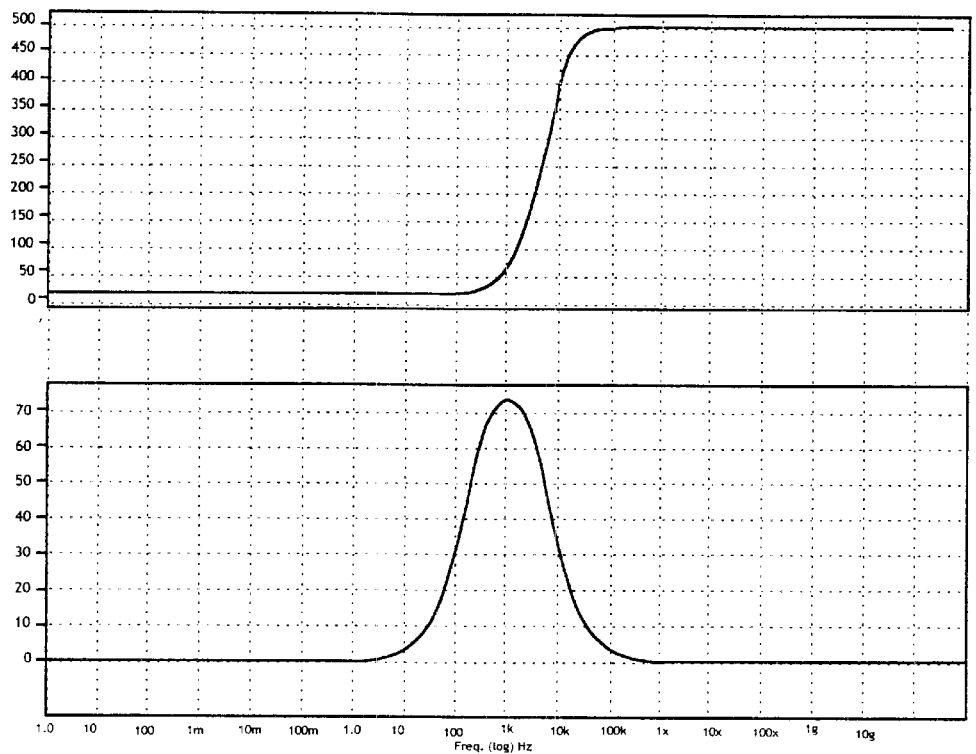
FIG. 11 is a Bode plot of the impedance magnitude (top) and phase (bottom) of the two equivalent circuits in FIG. 9a–9b and FIGS. 10a–10b.

Thus an inductor of approximately 10 mH is emulated using only capacitive and resistive impedance and an amplifier, all of which may be integrated in a silicon die. The Bode plot of FIG. 11 illustrates the magnitude of the impedance and phase of the two equivalent circuits of FIGS. 9a and 9b.

Figure 10A:
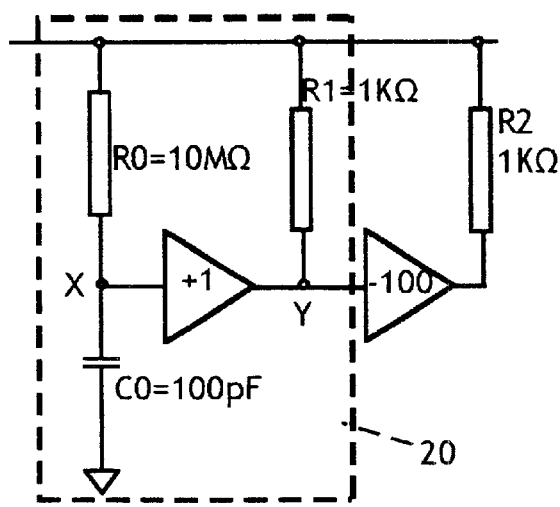
FIGS. 10a–10b are schematic views of impedance emulator circuits with real component values, and the resulting equivalent circuit.
Figure 10B:
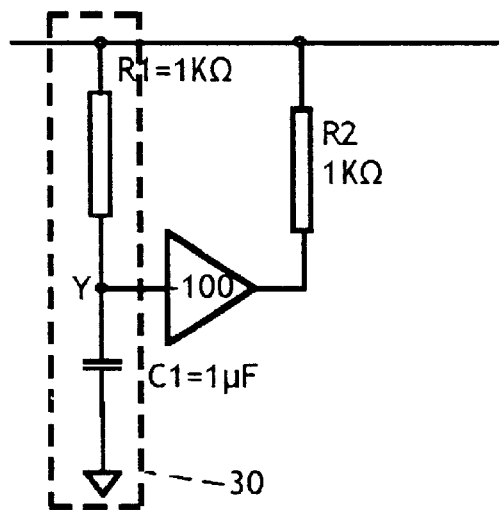

It is apparent that a capacitor of such large value as 1 μF would occupy an impractically large area on a silicon die. However, the emulation concept of the present invention may be compounded to achieve the equivalent circuit of FIG. 9b. With reference to FIG. 10a, the components within the box 20 comprise an impedance emulator, similar to the emulator of FIG. 6c, that replicates an impedance of 1 μF in series with a resistor of 1 KΩ at node Y, as shown in FIG. 10b. In FIG. 10b $C_1$=1 μF (same value as in FIG. 9a). Node Y, in turn, may be connected in the impedance emulator of FIG. 10b, which is similar to the replicator of FIG. 9a, resulting in a circuit equivalent to the circuit shown in FIG. 9b. Note emulator circuit 20 of FIG. 10a has been replaced by equivalent circuit 30 in FIG. 10b. Thus a large inductor may be emulated using components easily formed in silicon and occupying a small die area. Other combinations of impedance emulators disclosed herein may be made to achieve similar results. Note also that in FIG. 10a the input of the (–100) amplifier can be connected to either circuit node X or circuit node Y.

In general, the $V_X$ voltage source is not limited to a voltage divider, and may be provided by any suitable voltage source that is adapted to generate a similar impedance characteristic.

In the embodiments described above with reference to FIGS. 1–10, the impedance emulator circuits are shown connected between a voltage source and ground. However, the connection to ground is not necessary for operation of the invention. Rather, the impedance emulator of the invention may be floating at both ends, without reference to ground. Thus the connection to ground described above is merely one form of the broader invention.

Figures 12A, 12B, 12C:
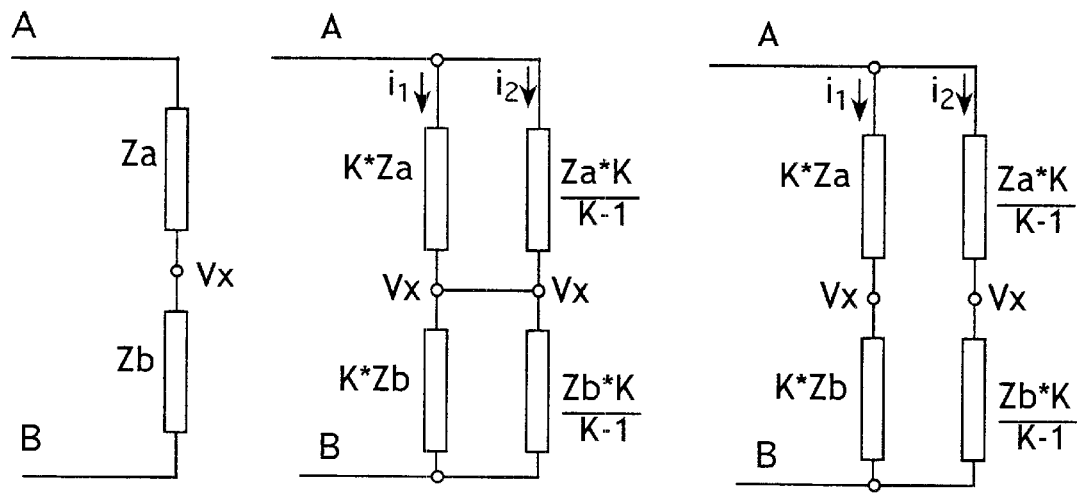
FIGS. 12A–12C are schematic views of a floating voltage divider and its equivalent floating parallel circuits.

With regard to FIG. 12A, impedances Za and Zb are connected in series between circuit nodes A and B having voltages Va and Vb, respectively, forming a voltage divider having a voltage Vx at its midpoint. An equivalent voltage divider, shown in FIG. 12B, includes a pair of impedances $KZ_a$ and $KZ_b$ connected between nodes A and B and carrying current $i_1$, and another pair of impedances $KZ_a/K-1$ and $KZ_b/K-1$ connected between nodes A and B carry current $i_2$. The midpoints of the paired impedances, which each produce a voltage $V_X$, may be connected together in a virtual short circuit. In FIG. 12C, the wire shorting the two $V_X$ nodes is removed. Due to linear scaling, the left hand impedance divider (impedances scaled by a factor of K) generates a voltage $V_X$ equal to the $V_X$ voltage generated by the right hand impedance divider (impedances scaled by a factor of K/(K-1)). There is no current flowing through the $V_X$ horizontal wire at any time, for all frequencies.

Figure 13A:
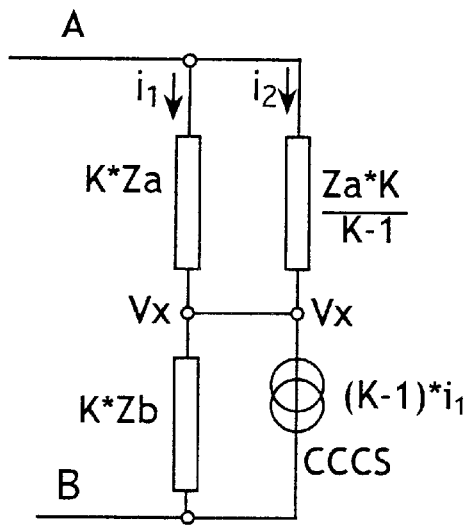
FIGS. 13A–13C are schematic views of a floating parallel impedance circuit, as in FIG. 12C, having one impedance replaced by a current controlled current source, and the components used to implement that current source.
Figure 13B:
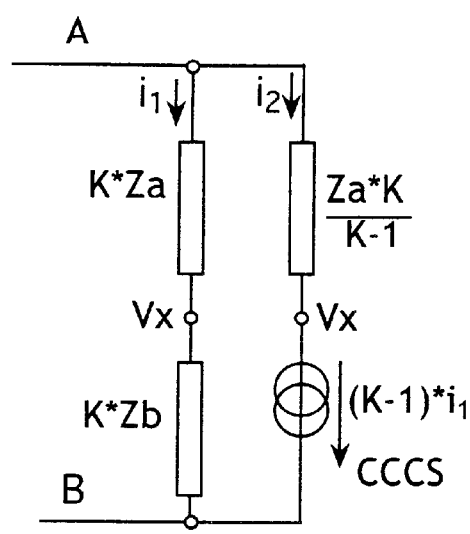
Figure 13C:
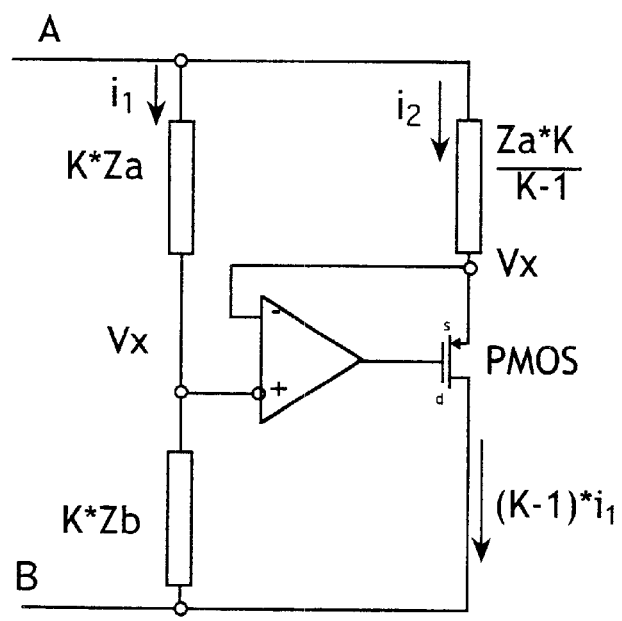

The circuits in FIGS. 13A–13C are derived from the circuits in FIGS. 12B–12C by replacing and emulating the Zb*K/(K-1) impedance. In FIG. 13A, the Zb*K/(K-1) impedance is emulated by a current controlled current source, cccs. The current value is $i_2=(K-1)*i_1$. The virtual short-circuit wire is present. There is zero current flowing through the Vx virtual short-circuit horizontal wire at all times and for all frequencies. The impedance at the AB terminals remains unchanged. It has the value $Z_{AB}=Za+Zb$. In FIG. 13B, the Zb*K/(K-1) impedance is emulated by a current controlled current source, cccs. Again, the current value is $i_2=(K-1)*i_1$. The virtual short-circuit wire is removed. The impedance at the AB terminals remains unchanged. It has the value $Z_{AB}=Za+Zb$. In FIG. 13C, the Zb*K/(K-1) impedance is emulated by a current source implemented with a PMOS transistor controlled by an operational amplifier. Should the PMOS transistor be replaced with a bipolar PNP transistor, a base-current error will be introduced. This can be done but is not recommended. The current value is $i_2=(K-1)*i_1$. The virtual short-circuit wire is not necessary by virtue of the amplifier action: both positive and negative amplifier inputs are forced to the same voltage potential, Vx. No ground node assumptions are made. This circuit will function regardless of the ground potential, i.e. terminals A and B are both floating. The impedance at the AB terminals remains unchanged: $Z_{AB}=Za+Zb$.

Figure 14A:
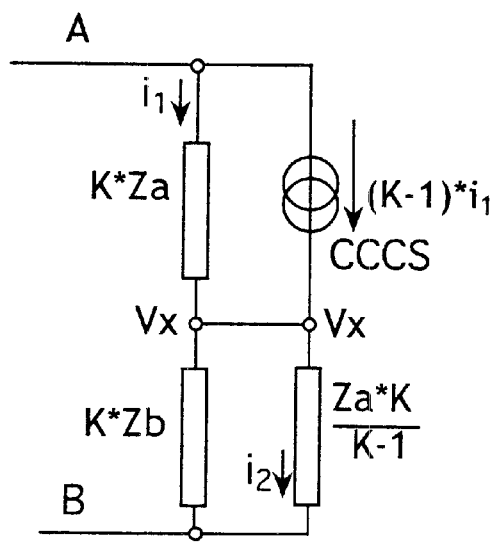
FIGS. 14A–14C are schematic views of a floating parallel impedance circuit, as in FIG. 12C, having another impedance replaced by a current controlled current source, and the components used to implement that current source.
Figure 14B:
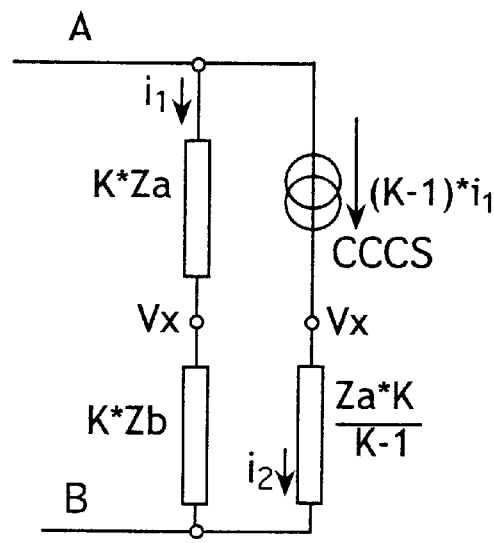
Figure 14C:
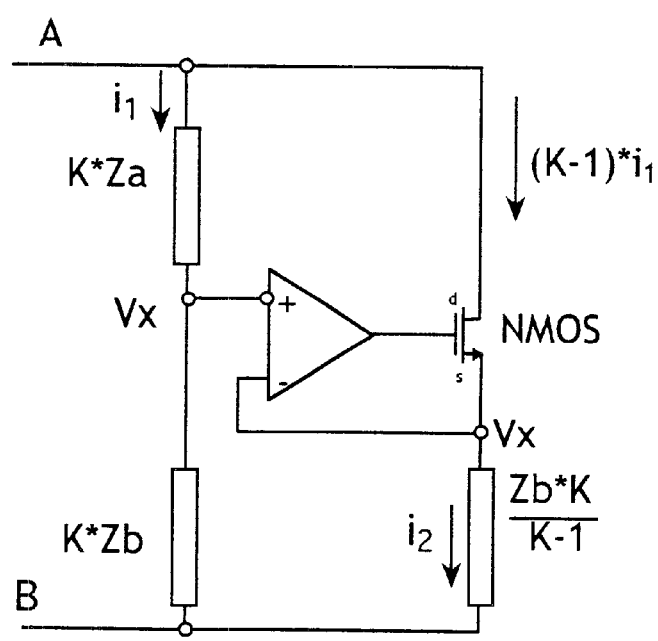

The circuits shown in FIGS. 12B–12C may be by replacing and emulating the Za*K/(K-1) impedance. As shown in FIG. 14A, this impedance is emulated by a current controlled current source CCCS producing a current value $i_2=(K-1)*i_1$. The virtual short circuit wire is present at Vx. There is zero current flowing through the Vx virtual short circuit at all times and for all frequencies. Once again, the impedance at the nodes AB is $Z_{AB}=Za+Zb$. This circuit is unchanged when the short circuit is removed at Vx, as shown in FIG. 14B. In FIG. 14C the Za*K/(K-1) impedance is emulated by a current source implemented with an NMOS transistor controlled by an operational amplifier. Should the NMOS transistor be replaced with a bipolar NPN transistor, a base-current error will be introduced. This can be done but is not recommended. The current value is $i_2=(K-1)*i_1$. The virtual short-circuit wire is not necessary by virtue of the amplifier action: both positive and negative amplifier inputs are forced to the same voltage potential, Vx. No ground node assumptions are made. This circuit will function regardless of the ground potential, i.e. terminals A and B are both floating. The impedance at the AB terminals remains unchanged: $Z_{AB}=Za+Zb$.

Figure 15A:
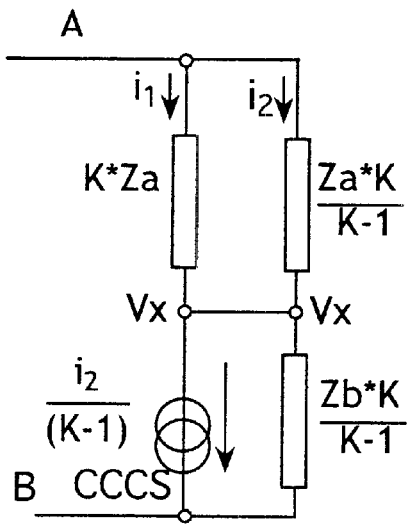
FIGS. 15A–15C are schematic views of a floating parallel impedance circuit, as in FIG. 12C, having a further impedance replaced by a current controlled current source, and the components used to implement that current source.
Figure 15B:
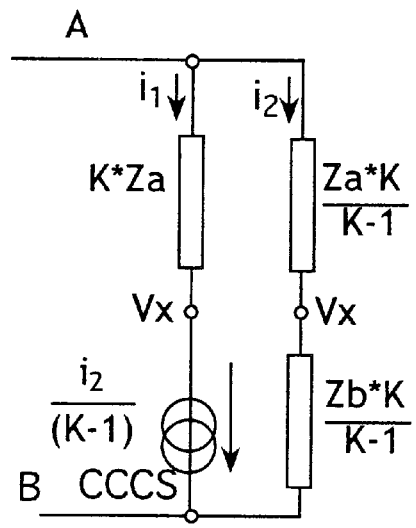
Figure 15C:
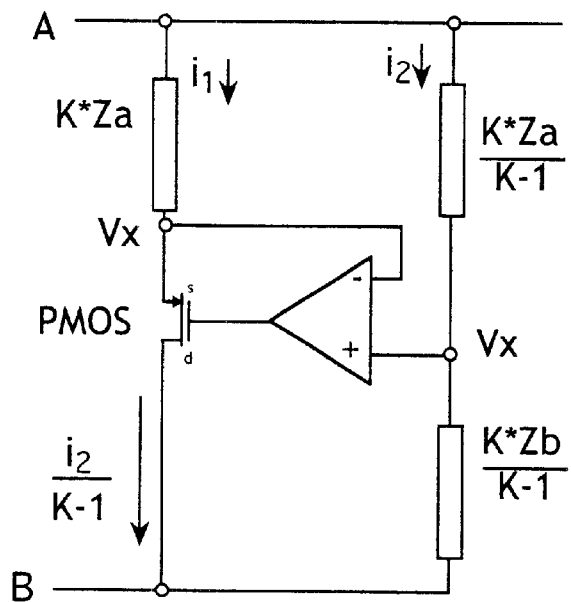

With regard to FIGS. 15A–15B, a similar is carried out by emulating the impedance K*Zb with a current controlled current source CCCS having a current $i_1=i_2/(K-1)$. The short circuit at Vx may be present or removed, as there is no current flowing through the short circuit at any time for all frequencies. As shown in FIG. 15C, the K*Zb impedance may be emulated by a current source implemented with a PMOS transistor controlled by an operational amplifier. The current value is $i_1-i_2/(K-1)$. As before, the short circuit wire is not necessary because of the amplifier action: both positive and negative amplifier inputs are forced to the same potential, Vx. No ground node assumptions are made. Once again, the impedance at the AB terminals remains unchanged: $Z_{AB}=Za+Zb$.

Figure 16A:
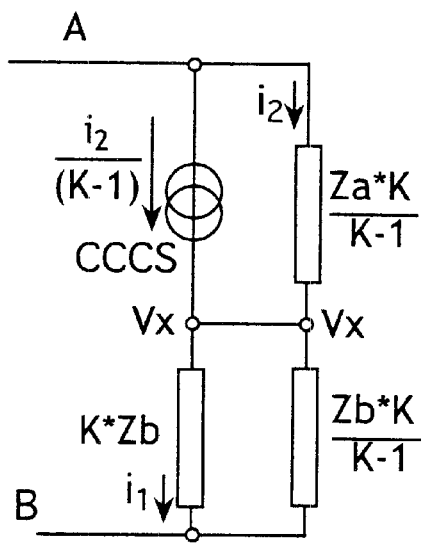
FIGS. 16A–16C are schematic views of a floating parallel impedance circuit, as in FIG. 12C, having a further impedance replaced by a current controlled current source, and the components used to implement that current source.
Figure 16B:
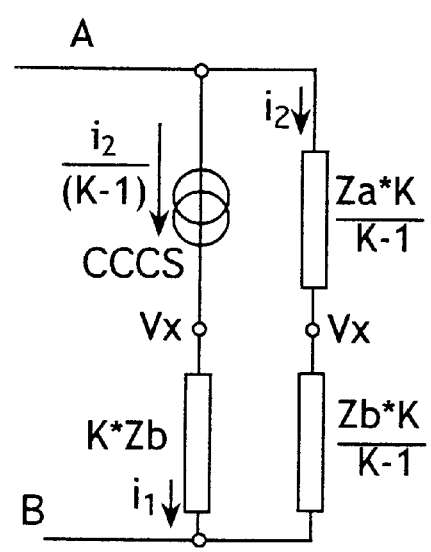
Figure 16C:
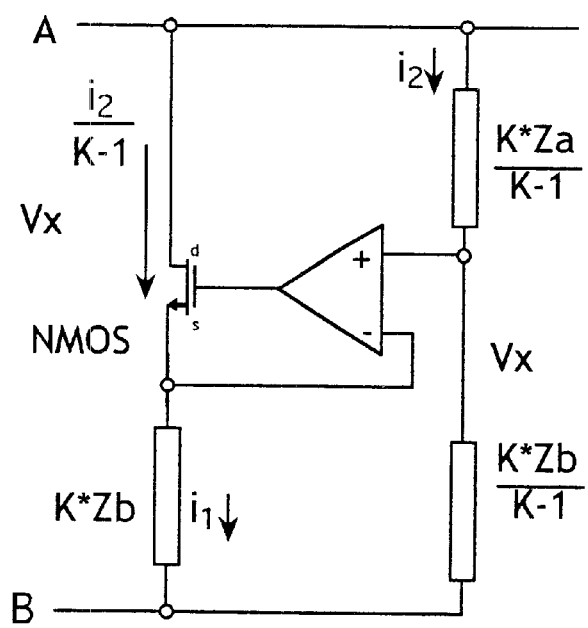

To complete the of the circuits of FIGS. 12B and 12C, the circuits of FIGS. 16A and 16B show the K*Za impedance emulated by current controlled current source CCCS generating current $i_1=i_2/(K-1)$. There is zero current flowing between the Vx nodes, at all time and for all frequencies, and the short circuit wire may be in place or removed. ent value is $i_1=i_2/(K-1)$. The virtual short-circuit wire is not necessary by virtue of the amplifier action: both positive and negative amplifier inputs are forced to the same voltage potential, Vx. No ground node assumptions are made. This circuit will function regardless of the ground potential, i.e. terminals A and B are both floating. The impedance at the AB terminals remains unchanged. It has the value $Z_{AB}=Za+Zb$.

In FIGS. 13C, 14C, 15C, and 16C the MOS transistor acts as a current source. The source current appears at the drain in its entirety. For a bipolar transistor current source the emitter current is larger than the collector current due to base current. To avoid current errors in bipolar designs (errors which translate in wrong impedance values being emulated) the base current of the bipolar transistor has to be returned to the circuit node of the collector utilizing, for example, the base-current cancellation technique or mirroring back into the collector the base current.

In the embodiments shown in FIGS. 13–16, it is clear that the floating impedance emulation requires that the same amount of current sourced by node "A" be returned to node "B".

The invention also provides an inductive impedance emulator that has a floating potential, without reference to a ground potential. With regard to FIG. 17A, the inductive impedance emulator of FIG. 8A may be modified by the addition of a current controlled current source CCCS that returns to terminal B the $i_2$ current drawn from terminal A. A1 the $i_1$ current flows from terminal A through R1 and C1 and is returned in its entirety to terminal B. For the floating impedance emulator to work, the same concept must be applied to $i_2$ current: it must be returned in its entirety to terminal B.

With reference to FIG. 17B, the inductor circuit equivalent to the emulator of FIG. 17A comprises resistor R3 in parallel connection with a combination of inductor LA and resistor R4. R3 equals the parallel resistance of R1 and R2. The other component values are:

$$R4 = \frac{1}{(N/R2 - 1/R1)}$$

where $|-N1>>1$ $$L4 = C1*R1*R4$$

One practical implementation of the floating inductor emulation above is shown in FIG. 18. Amp1 is a voltage buffer (gain=+1) that replicates the Vx voltage for the Amp2 input resistor Rf. (Current from the R1–C1 path, $i_1$, should not be diverted into the input resistor Rf of Amp2). Amp2 has Rf and N*Rf feedback resistors providing a negative gain of −N. The Amp2 voltage gain is $$Vy-Vb=(-N*Rf/Rf)*(Vx-Vb.)$$

The output voltage of Amp2 is Vy referenced to Vb. Amp3 and the PMOS transistor form a controlled current source that returns the $i_2$ current to the terminal B. Amp3 also forces the voltage at its negative input, the lower end of R2, to have the same value of Vy equal to the voltage at its positive input.

Figure 19A:
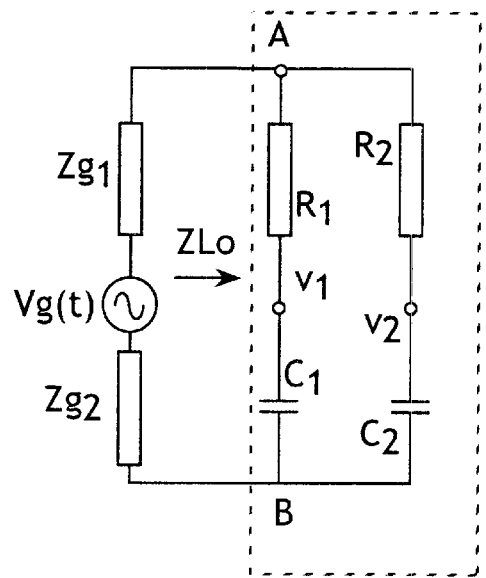
FIGS. 19A–19B are schematic views illustrating the Theorem of the Virtual Short Circuit described herein.

The elaborations given above lead to a Theorem of the Virtual Short Circuit, as follows, with reference to FIG. 19A:

Given a voltage signal generator Vg(t) (or Vg(s), where s=jω)), in series with impedances $Zg_1$ and $Zg_2$ of unspecified value, and The (partial) time constant is defined as:

$$R1*C1=R2*C2=\tau$$

Figure 19B:
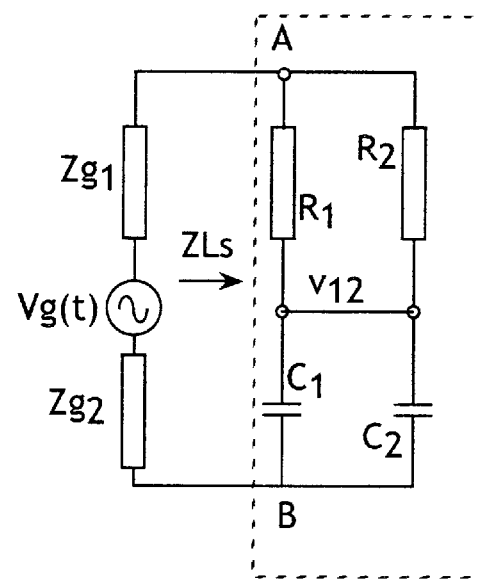
Figure 20:
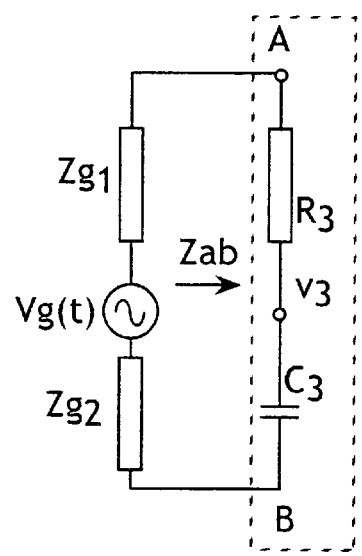
FIG. 20 is a schematic view of the equivalent circuit of FIGS. 19A–19B.
Figure 21A:
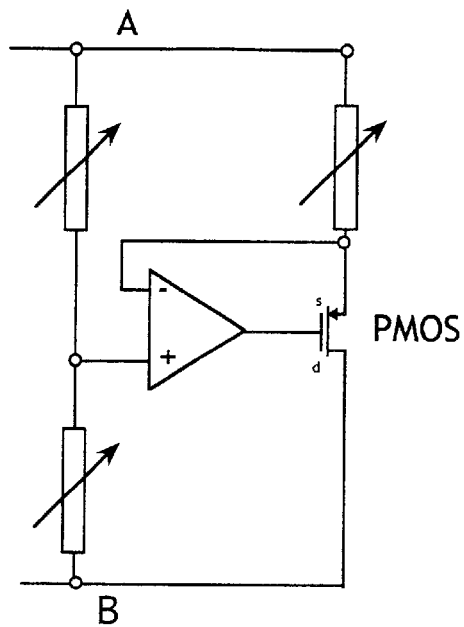
FIGS. 21A–21D are schematic views showing various possible variable floating impedance emulator circuits.
Figure 21B:
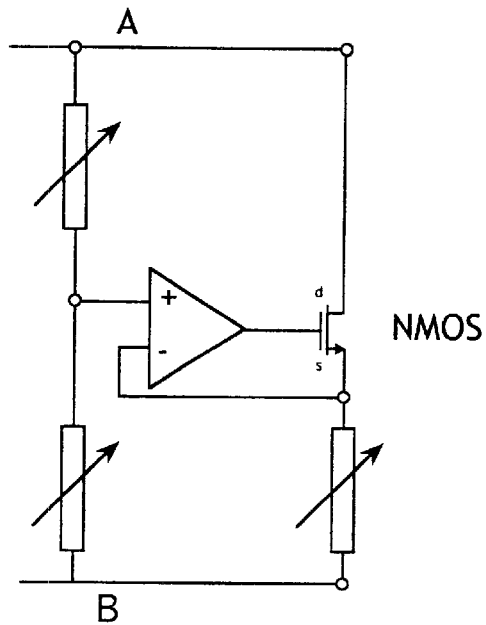
Figure 21C:
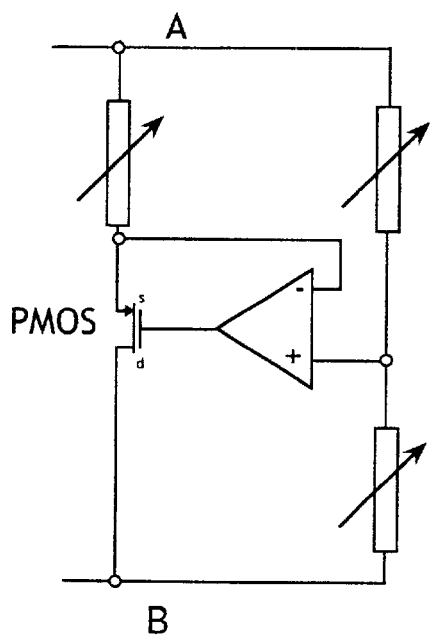
Figure 21D:
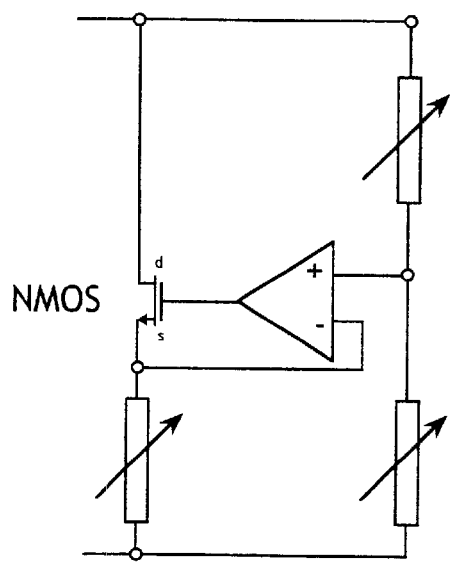

Then the same value (partial) time constant exists for the shorted parallel RC load of the circuit in FIG. 19B:

$$(R1\|R2)*(C1\|C2) = \frac{(R1*R2)}{(R1+R2)}*(C1+C2) = \tau$$

where the two resistors are connected in parallel and the two capacitors are connected in parallel via the horizontal short of voltage potential $v_{12}$ in FIG. 19B.

Furthermore, the load impedances across nodes AB are the same:

ZLo=ZLs

And their time and frequency responses are:

$$v_1(t)=v_2(t)=v_{12}(t)$$

$$v_1(s)=v_2(s)=v_{12}(s)$$

The time and frequency responses track each other with zero relative delay for any signal generator voltage signals Vg, and are independent of the values of $Zg_1$ and $Zg_2$.

Note that the voltage signal generator and series impedance combination may be replaced by an equivalent current source in parallel with an equivalent impedance. At any time and at any generator frequencies there will be zero current flowing through the horizontal short circuit wire $v_{12}$ of FIG. 19B. This wire has no effect upon circuit behavior. This absence or presence (open or short) of the $v_{12}$ connection resulting in no change in circuit behavior, enables impedance emulation of floating impedances, both capacitors and inductors.

Furthermore, a capacitor always has a small finite-series parasitic external resistance (e.g., terminals, connections, traces on PCBs, metal trace resistance in IC layouts, etc) and internal resistance (dielectric loss, plate resistance). The series parasitic resistance can be used to emulate and replace a large value capacitor with a capacitor of much smaller physical size and smaller capacitance value, with scaled resistors, and with an amplifier. The quality and performance of the emulated capacitor will depend upon the amplifier performance and characteristics (dc offset, gain, frequency response, noise), upon the resistor ratio, and upon the smaller capacitor absolute value. A small resistor can be inserted in series with an existing large capacitor for the purpose of replacing the combination of large capacitor and added, small, series resistor with an active capacitor composite (smaller value capacitor, plus scaled resistors, plus amplifier), resulting in impedance emulation. The series/parallel load represented by an equivalent series combination of resistance R3 and capacitor C3. R3=R4∥R5=R1*R2/(R1+R2), and C3=C1+C2.

Figure 22A:
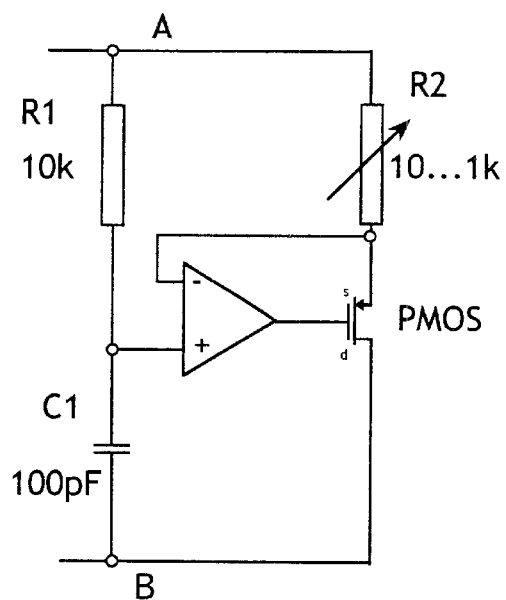
FIGS. 22A–22B are schematic views of one possible floating variable impedance emulator, and the resulting equivalent circuit.
Figure 22B:
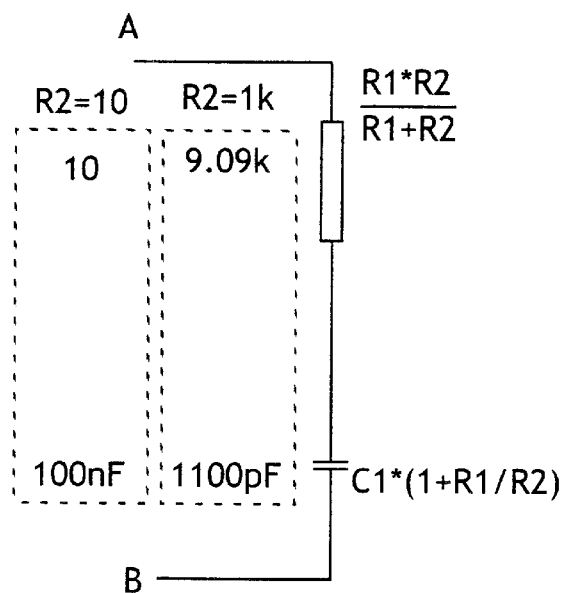

A further extension of the invention involves emulating a variable impedance, either capacitive or inductive. As shown in FIGS. 21A–21D, the various circuits for achieving this purpose are shown, where each impedance may be variable, and no ground connection is required. One possible implementation of the variable 10Ω–1 kΩ. The equivalent circuit, shown in FIG. 22B, has a resistor in series with a capacitor. The equivalent series resistor has the value of R1∥R2=R1*R2/(R1+R2), while the emulated capacitor has the value of C1*(1+R1/R2). The emulated capacitance has a range from 100 nF (at R2=10Ω) to 1100 pF (at R2=1 kΩ). Thus the variable impedance capacitive embodiment exhibits all the advantages of previous embodiments, such as emulating capacitance far larger than the circuit capacitor component, while providing variability through a great range.

Figure 23A:
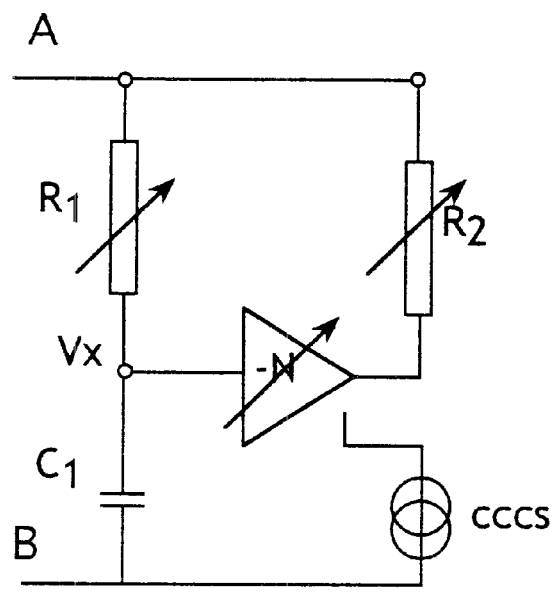
FIGS. 23A–23B are schematic views showing a variable floating inductor emulator, and one practical circuit for carrying out the variable floating inductor emulator.
Figure 23B:
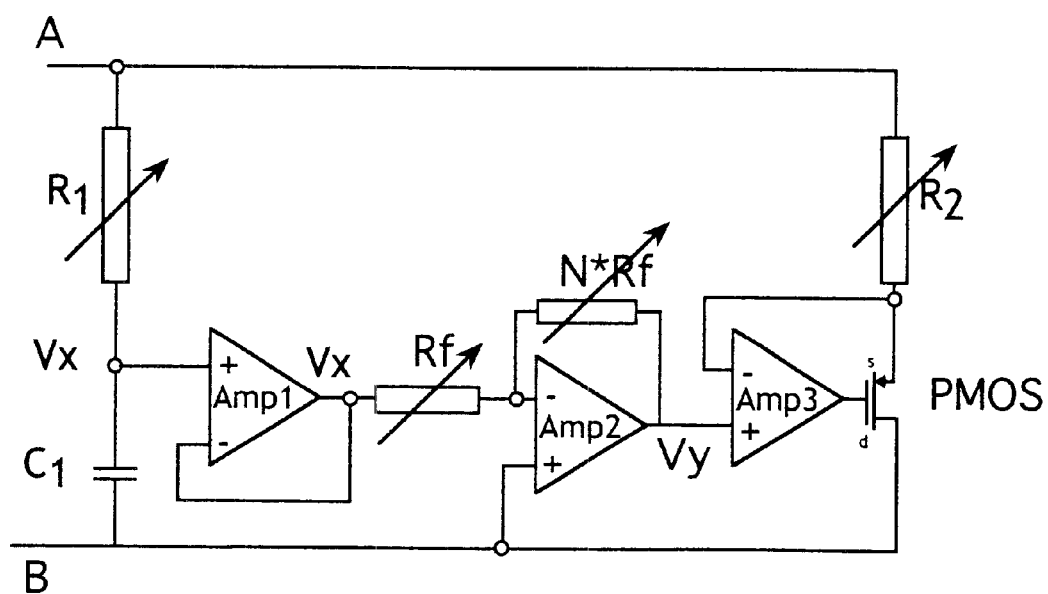

With reference to FIG. 23A, there is shown a general emulator circuit for emulating a floatingvariable inductor. Any or all of the components R1, R2, or the negative gain operational amplifier may be varied, and no ground reference is required. One practical embodiment of this circuit, shown in FIG. 23B, includes an amplifier Amp2 having a gain (−N) that is varied through controlling the gain/feedback resistors Rf and N*Rf connected to Amp2. Also, resistors R1 and R2 may be varied, though not necessarily. The resulting equivalent circuit for any setting of the variable components is the same as shown in FIG. 17B.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A impedance emulating device, including:
    a voltage divider connected between two circuit nodes having a potential difference, said voltage divider having a midpoint node at voltage $V_x$;
    said voltage divider including at least one impedance having a reactive component;
    amplifier means having an output, and having an input connected to $V_x$;
    a load impedance connected between said output and one of said circuit nodes;
    said voltage divider and said load impedance having values scaled so that said output replicates the output of an emulated impedance of predetermined reactance and magnitude.

2. The impedance emulating device of claim 1, wherein said amplifier has a gain of +1.

3. The impedance emulating device of claim 1, wherein said amplifier has a negative gain.

4. The impedance emulating device of claim 1, wherein said voltage divider includes a variable impedance, whereby said emulated impedance is variable in response to changes in said variable having an output connected to the gate of said transistor.

5. The impedance emulating device of claim 1, wherein said amplifier means includes a transistor having a source/drain circuit connected between said load impedance and the other of said circuit nodes.

6. The impedance emulating device of claim 5, wherein said amplifier means includes an OP AMP, the output of said OP AMP being connected to the gate of said transistor.

7. The impedance emulating device of claim 6, wherein said OP AMP has one input connected to Vx and another input connected to the junction of said load impedance with said source/drain circuit.

8. A impedance emulating device, including:
   a voltage divider connected between two circuit nodes having a potential difference, said voltage divider having a midpoint node at voltage $V_X$;
   said voltage divider including at least one impedance having a reactive component;
   an OP AMP having one input connected to $V_X$;
   a load impedance connected at one end to one of said circuit nodes;
   a transistor having a gate connected to the output of said OP AMP and a source/drain circuit connected between the other end of said load impedance and the other of said circuit nodes;
   the other input of said OP AMP connected to said other end of said load impedance;
   said voltage divider and said load impedance having values scaled so that the impedance between said circuit nodes replicates an emulated impedance of predetermined reactance and magnitude.

9. The impedance emulating device of claim 8, wherein said OP AMP has a gain of +1.

10. The impedance emulating device of claim 8, wherein said OP AMP has a negative gain.

11. The impedance emulating device of claim 8, said voltage divider including a variable impedance, whereby said emulated impedance is variable in response to changes in said variable impedance.

12. In an integrated circuit construction, a method for emulating a large reactive impedance, comprising the steps of:
   providing a voltage divider connected between two circuit nodes having a potential difference, said voltage divider having a midpoint node at voltage $V_X$;
   said voltage divider including at least one impedance having a reactive component;
   providing an OP AMP having one input connected to $V_X$;
   connecting one end of a load impedance to one of said circuit nodes;
   providing a transistor having a gate connected to the output of said OP AMP and a source/drain circuit connected between the other end of said load impedance and the other of said circuit nodes;
   connecting the other input of said OP AMP to said other end of said load impedance;
   said voltage divider and said load impedance having values scaled so that the impedance between said circuit nodes replicates an emulated impedance of predetermined reactance and magnitude.

13. The method for emulating a large reactive impedance of claim 12, wherein said voltage divider includes a variable impedance, whereby said emulated impedance is variable in response to changes in said variable impedance.

14. The impedance emulating device of claim 13, wherein said OP AMP has a gain of +1.

15. The impedance emulating device of claim 13, wherein said OP AMP has a negative gain.

* * * * *